US007761769B1

(12) United States Patent
Woodings et al.

(10) Patent No.: US 7,761,769 B1
(45) Date of Patent: Jul. 20, 2010

(54) METHOD AND APPARATUS FOR USING VALID BITS FOR ERASURE CORRECTION

(75) Inventors: Ryan Winfield Woodings, Boise, ID (US); Dave Estlick, Boise, ID (US); David G. Wright, Escondido, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1202 days.

(21) Appl. No.: 11/083,534

(22) Filed: Mar. 18, 2005

Related U.S. Application Data

(60) Provisional application No. 60/558,172, filed on Mar. 26, 2004.

(51) Int. Cl.
*H03M 13/00* (2006.01)

(52) U.S. Cl. .......................... 714/758; 714/7; 714/710; 714/799

(58) Field of Classification Search .................. 714/758, 714/799; 375/141, 143, 144
See application file for complete search history.

(56) References Cited

U.S. PATENT DOCUMENTS 5,280,474 A * 1/1994 Nickolls et al. ............. 370/389
5,870,412 A * 2/1999 Schuster et al. ............. 714/752
5,961,159 A * 10/1999 Ekman ....................... 285/305
5,991,632 A * 11/1999 Guillame .................... 455/466
6,003,151 A * 12/1999 Chuang ...................... 714/752
6,069,884 A * 5/2000 Hayashi et al. ............. 370/335
6,473,449 B1 * 10/2002 Cafarella et al. ............ 375/141
6,606,726 B1 * 8/2003 Wilhelmsson et al. ....... 714/758
6,658,076 B1 * 12/2003 Hayata ....................... 375/377
6,728,296 B1 * 4/2004 Yung ......................... 375/141
6,728,924 B1 * 4/2004 Lou et al. ................... 714/776
6,810,501 B1 * 10/2004 Ferguson et al. ............ 714/781

OTHER PUBLICATIONS

"Deriving the XOR Function," <http://www.play-hookey.com>, accessed Feb. 11, 2005; 2 pages.

* cited by examiner

*Primary Examiner*—Esaw T Abraham

(57) ABSTRACT

A wireless device decodes Direct Sequence Spread Spectrum (DSSS) encoded data and identifies data that can not be successfully DSSS decoded (invalid data). A checksum operation uses successfully decoded DSSS data (valid data) to correct the identified invalid corrupted data. The improved error correction leverages the valid and invalid bit information normally provided in DSSS systems to more effectively correct corrupted data bits. The improved error correction increases the processing gain of wireless devices thus increasing the effective wireless range without having to increase transmit power.

17 Claims, 6 Drawing Sheets

US 7,761,769 B1

METHOD AND APPARATUS FOR USING VALID BITS FOR ERASURE CORRECTION

This application claims priority from prior U.S. Provisional Application Ser. No. 60/558,172, filed Mar. 26, 2004.

TECHNICAL FIELD

The present invention relates generally to electronic circuits, and in particular to circuits for performing an error correction function.

BACKGROUND OF THE INVENTION

Error correction is a technique widely used to increase accuracy of transmitted data as well to reduce the amount of data that must be retransmitted. While the typical error rate in wired systems is almost negligible, the error rate for wireless radio communications is significant. Typically the key to error correction is redundancy. Error correction techniques such as Reed-Solomon and Viterbi typically transmit 1.5-3 times the amount of original data in order to send enough information to enable the receiver to detect and correct errors.

Data in typical data streams has two states: 0 and 1. During transmission, bits may become inverted due to noise and/or a faded signal. Conventional error correction schemes must first detect if a data stream has corrupted bits and then identify which bits are corrupted before it can begin to correct the identified corrupted bits. Due to the difficulties in determining which bits are corrupted, most error correction schemes can only correct a limited number of corrupted bits, if any at all. If corrupted data in the data stream cannot be corrected, the data is retransmitted until it is correctly received. Wireless systems that operate in noisy environments (such as the 2.4 GHz Industrial Scientific Medial (ISM) band) must transmit considerable amounts of error correction information in order to reliably receive and correct data. This error correction information creates overhead that reduces the effective bandwidth of the system and increases power consumption.

An error-correction solution is needed that has low overhead and is reliable in noisy environments.

SUMMARY OF THE INVENTION

A wireless device decodes Direct Sequence Spread Spectrum (DSSS) encoded data and identifies data that can not be successfully DSSS decoded (invalid data). A checksum operation uses successfully decoded DSSS data (valid data) to correct the identified invalid corrupted data. The improved error correction leverages the valid and invalid bit information normally provided in DSSS systems to more effectively correct corrupted data bits. The improved error correction increases the processing gain of wireless devices thus increasing the effective wireless range without having to increase transmit power.

The foregoing and other objects, features and advantages of the invention will become more readily apparent from the following detailed description of a preferred embodiment of the invention which proceeds with reference to the accompanying drawings.

DETAILED DESCRIPTION

Valid Bit Error Correction (VBEC) corrects corrupted bits while reducing processing overhead and bandwidth typically required for noisy transmission environments. The VBEC increases data transmission success by leveraging the valid and invalid bit information that is normally provided in Direct Sequence Spread Spectrum (DSSS) systems. This effectively increases bandwidth for wireless communications by reducing the amount of data that is required to be retransmitted. By using the valid bit information identified during DSSS decoding, the VBEC also provides more effective error correction that is more computationally efficient.

Figure 1:
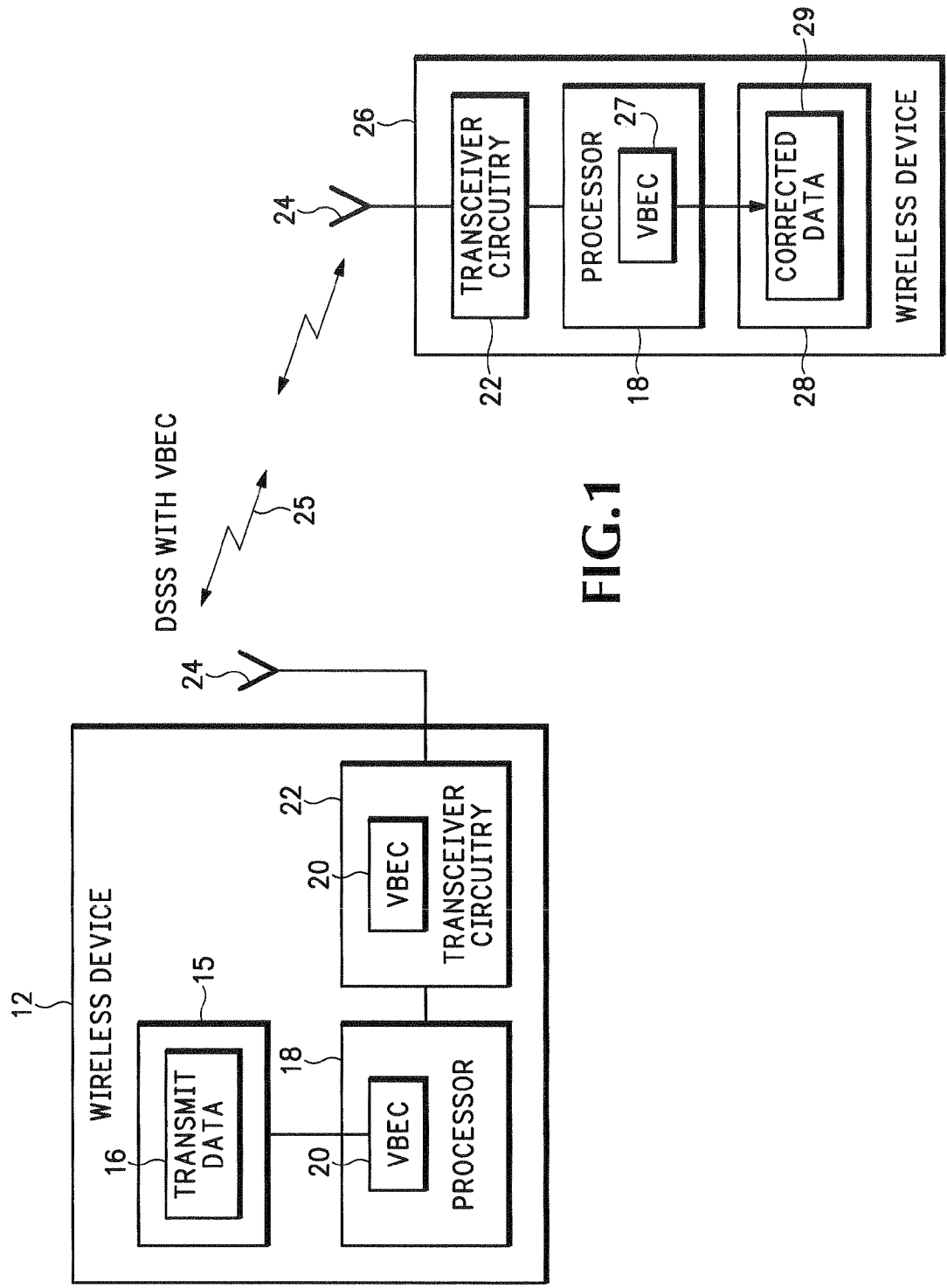
FIG. 1 shows how Valid Bit Error Correction (VBEC) is used in a Direct Sequence Spread Spectrum (DSSS) system.

FIG. 1 shows two wireless devices 12 and 26 that each include transceiver circuitry 22 coupled to antennas 24 used for transmitting and receiving wireless DSSS signals 25. The wireless devices 16 and 26 include a processor 18 for conducting VBEC 20 and 27, respectively described below. In an alternative embodiment, the VBEC 20 and 27 may be performed in the transceiver circuitry 22 or in any other convenient processing circuitry in wireless devices 12 and 26. The wireless devices 12 and 26 can be any type of device that needs to wirelessly transfer data. For example, the wireless devices can be laptop computers with wireless 802.11 modems, wireless Universal Serial Bus (USB) peripheral devices, game controllers, Personal Digital Assistants (PDA), etc.

In this example, the wireless device 12 contains transmit data 16 in a memory 15 that needs to be transmitted to wireless device 26. Wireless device 12 conducts Valid Bit Error Correction (VBEC) encoding 20 on the data 16 before it is transmitted to wireless device 26. The data is encoded into DSSS encoded data by processor 18 and wirelessly transmitted over signals 25 to wireless device 26. The transceiver 22 in wireless device 26 converts signals 25 back into DSSS encoded data. The VBEC decoder 27 then uses valid and invalid bit information identified during DSSS decoding to correct data that may have been corrupted during the wireless transmission. The corrected data 29 is then output to memory 28.

Figure 2:
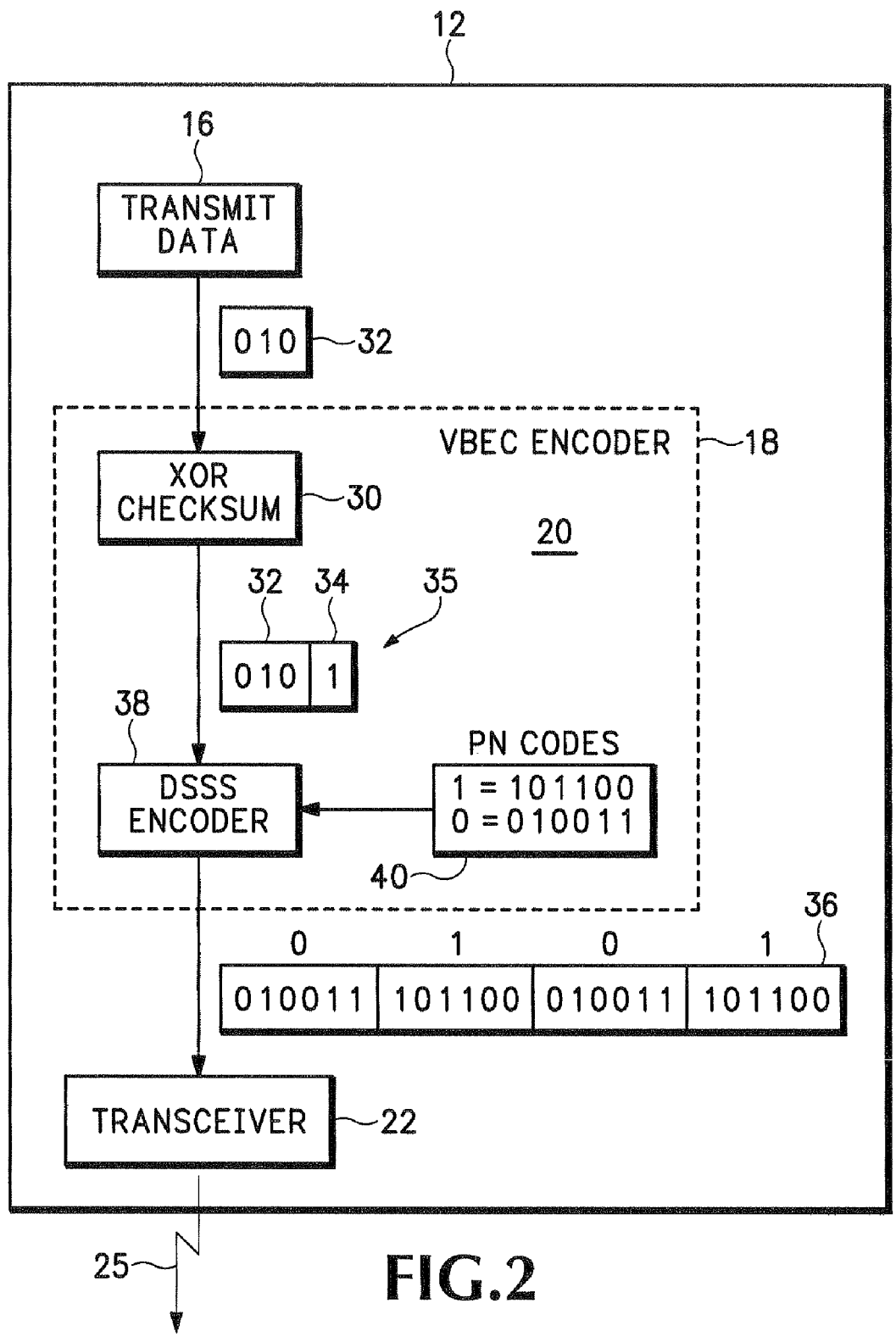
FIG. 2 shows in more detail the VBEC performed in a transmitting wireless device.

FIG. 2 describes the VBEC encoding 20 in more detail. The wireless device 12 contains transmit data 16 that needs to be transmitted to wireless device 26 (FIG. 1). A first set of data bits 32 from transmit data 16 are shown for explanation purposes. The VBEC encoder 20 conducts an Exclusive-OR (XOR) checksum operation 30 on data bits 32. In the XOR checksum operation 30, the processor 18 XORs the data bits 32 to generate a checksum value 34. For example, the result of the XOR for the first two data bits '0' and '1' results in: 0 XOR 1=1. Then XORing the result '1' with the final data bit '0' results in: 1 XOR 0=1. The XOR checksum operation 30 appends the resulting checksum value 34 to the data bits 32 producing data bits 35.

The data bits 35 are then encoded by a DSSS encoder 38. The DSSS encoder 38 is shown using two Pseudo Noise (PN) codes 40 that represent logic 0 and logic 1 values. The logic 1 PN code has the PN chip or bit value '101100' and the logic 0 PN code has the inverse PN bit value '010011'. The PN codes 40 typically have larger 32 or 64 bit sequences. Further, there may be more than two PN codes 40 used for encoding the data bits 35. However, for explanation purposes only two short PN codes are show in FIG. 2. It should be understood that any PN code length, PN code value, or number of PN codes can be used in the VBEC encoder 20.

The DSSS encoder 38 uses the PN codes 40 to encode each one of the data bits 35 into PN encoded data 36. For example, the first logic 0 value in data bits 35 is encoded into the PN encoded bit sequence as '010011' and the second logic 1 value in data bits 35 is encoded into the PN encoded bit sequence '101100'. The PN encoded bit stream 36 is transmitted by the transceiver 22 as wireless DSSS signals 25 to the wireless device 26.

Figure 3:
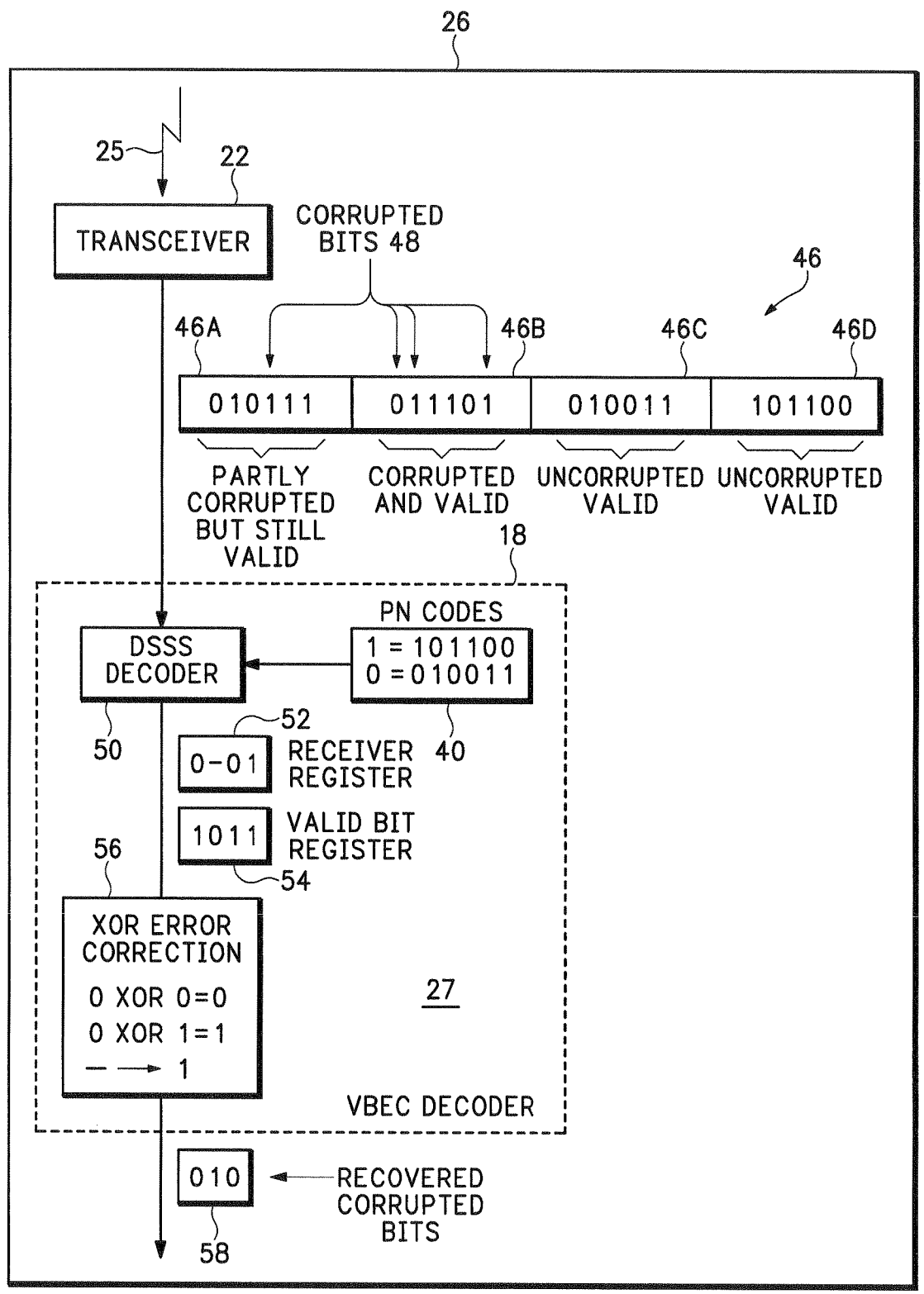
FIG. 3 shows in more detail the VBEC performed in a receiving wireless device.
Figure 4:
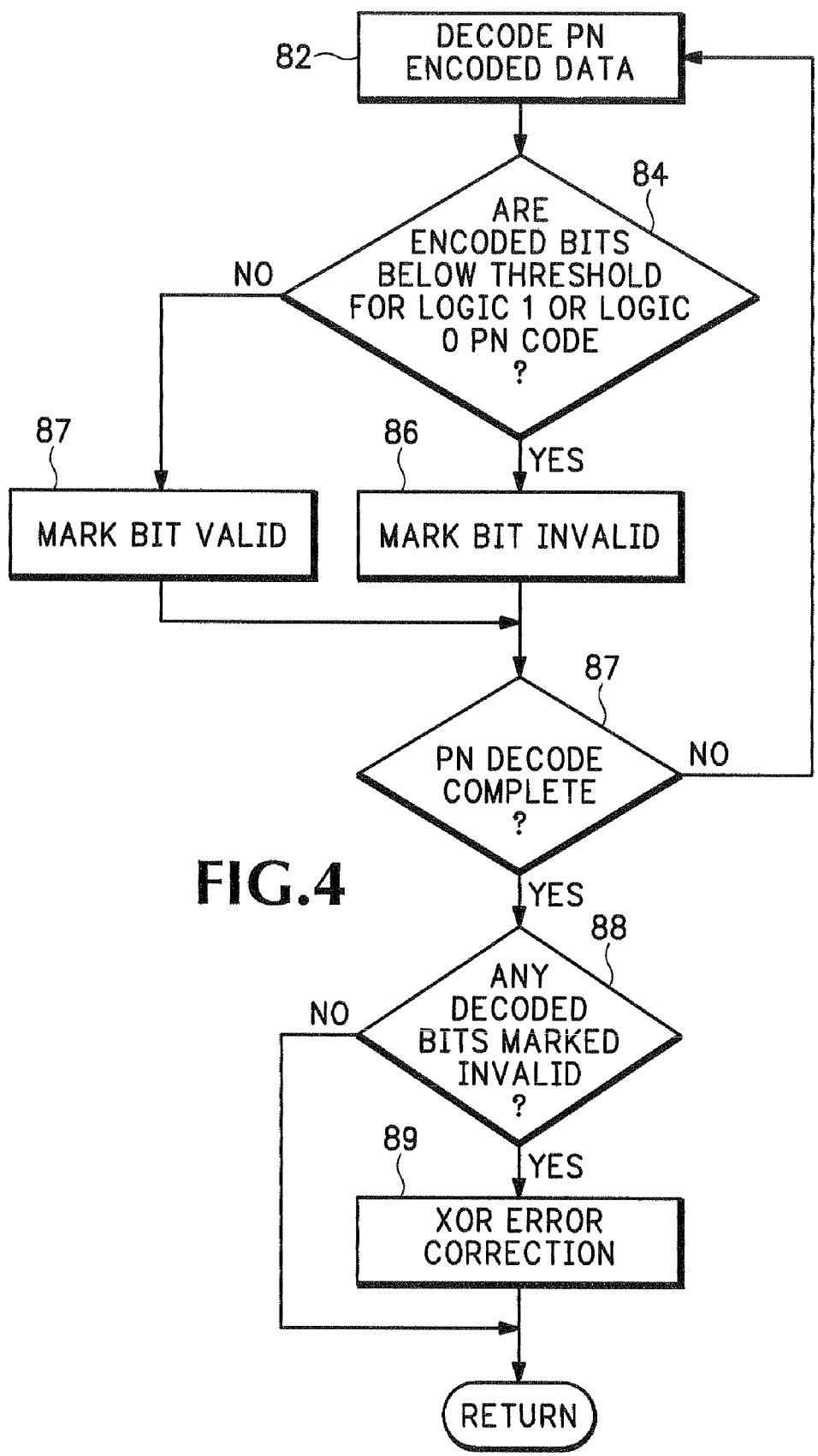
FIG. 4 is a flow diagram describing the operations in the receiving wireless device shown in FIG. 3.

FIGS. 3 and 4 describe in more detail the VBEC decoder 27 in the wireless device 26. The wireless DSSS signals 25 are received by the transceiver 22 in wireless device 26 and converted into a PN encoded bit stream 46. In a non-corrupted wireless transmission, bit stream 46 would have the same PN values as PN encoded bit stream 36 in FIG. 2. However some of the bits 48 in the received PN encoded bit stream 46 are corrupted during wireless transmission.

For example, a completely uncorrupted logic 0 PN encoded data value should have the PN bit sequence '010011'. However, the PN bit sequence 46A in FIG. 3 has the PN bit values '010111'. A second PN bit sequence 46B is supposed to correspond to a second logic 1 value in originally sent data bits 35 in FIG. 2. However, instead of receiving the logic 1 PN bit sequence '101100', the wireless device 26 receives the PN bit sequence '011101'. The third PN bit sequence 46C and the fourth PN bit sequence 46D are received with no corrupted PN bit values. In other words, the PN bits values 46C and 46D completely match the PN codes 40 (FIG. 2) corresponding with the last two logic 0 and logic 1 values in data bits 35.

Referring to block 82 in FIG. 4, the DSSS decoder 50 decodes the PN coded bits 46 into their corresponding logic data values. Depending on the number of non-matching PN bits in block 84 (FIG. 4), the decoded bits in receive register 52 (FIG. 3) are identified in valid bit register 54 as either valid bits or invalid bits. In this example, a threshold value of one corrupted PN bit is used to distinguish valid data bits from invalid data bits in receive register 52. Of course, the threshold level can vary depending on the number of bits used in the PN codes 40. For example, a 32 chip PN code might use a threshold of say 27 matching PN bits to distinguish a valid decoded data bit from an invalid decoded data bit.

The DSSS decoder 50 in block 84 correlates the first PN bit sequence 46A with PN codes 40. Since PN bit sequence 46A matches all of the PN bits for the logic 0 PN code 40, except one, the PN bit sequence 46A is decoded as a logic 0 value in receive register 52. In block 87 of FIG. 4, the DSSS decoder 50 marks the first decoded logic 0 bit as valid in valid bit register 54 (e.g., PN bit matches ≧5).

The second PN bit sequence 46B does not have at least five PN bits that match either the logic 0 or logic 1 PN code 40. The DSSS decoder 50 in block 86 marks the second bit in receive register 52 as a "don't know" (−). This may simply mean decoder 50 does not enter any data value into receive register 52. The DSSS decoder 50 then enters a logic 0 value into the corresponding location in valid bit register 54 to identify the data bit in register 52 as invalid. The third PN bit sequence 46C completely matches the logic 0 PN code 40. Accordingly in block 87, a 0 data value is entered into data bit register 52 and a 1 value (valid) is entered into a corresponding bit location in valid bit register 54.

Similarly, all the PN bits 46D for the encoded checksum value match the logic 1 PN code 40. Accordingly in block 86, a logic 1 data value is entered into the receive register 52 and a logic 1 value is entered into a corresponding bit location in valid bit register 54. The DSSS decoding is repeated in block 87 for all the received PN encoded bits.

Both the data bits in receive register 52 and the valid bit identifiers in valid bit register 54 are used in error correction operation 56. If any of the PN decoded bits in receive register 52 are identified as invalid in block 88, the error correction 56 in block 89 conducts an Exclusive-OR (XOR) operation on the remaining valid bits.

For example, the first valid bit in receive register 52 is a logic 0 value, and the second valid bit in receive register 52 is also a logic 0 value. The error correction operation 56 conducts an Exclusive-OR operation on the two valid bits to generate the value: 0 XOR 0=0. The result of the first XOR operation is then XORed with the final valid logic 1 value in receive register 52 generating the value: 0 XOR 1=1. The VBEC decoder 27 replaces the invalid data value '-' in receive register 52 with the logic 1 value resulting from the XOR operation. The corrected data bits 58 are then sent to an application in wireless device 26.

Thus, the corrupted bit in receive register 52 is corrected and the resulting decoded bits '010' are the same as data bits 32 initially transmitted by wireless device 12. As a result, the processing gain of the Direct Sequence Spread Spectrum (DSSS) wireless devices 12 and 26 is improved without having to increase transmission or reception power.

Figure 5:
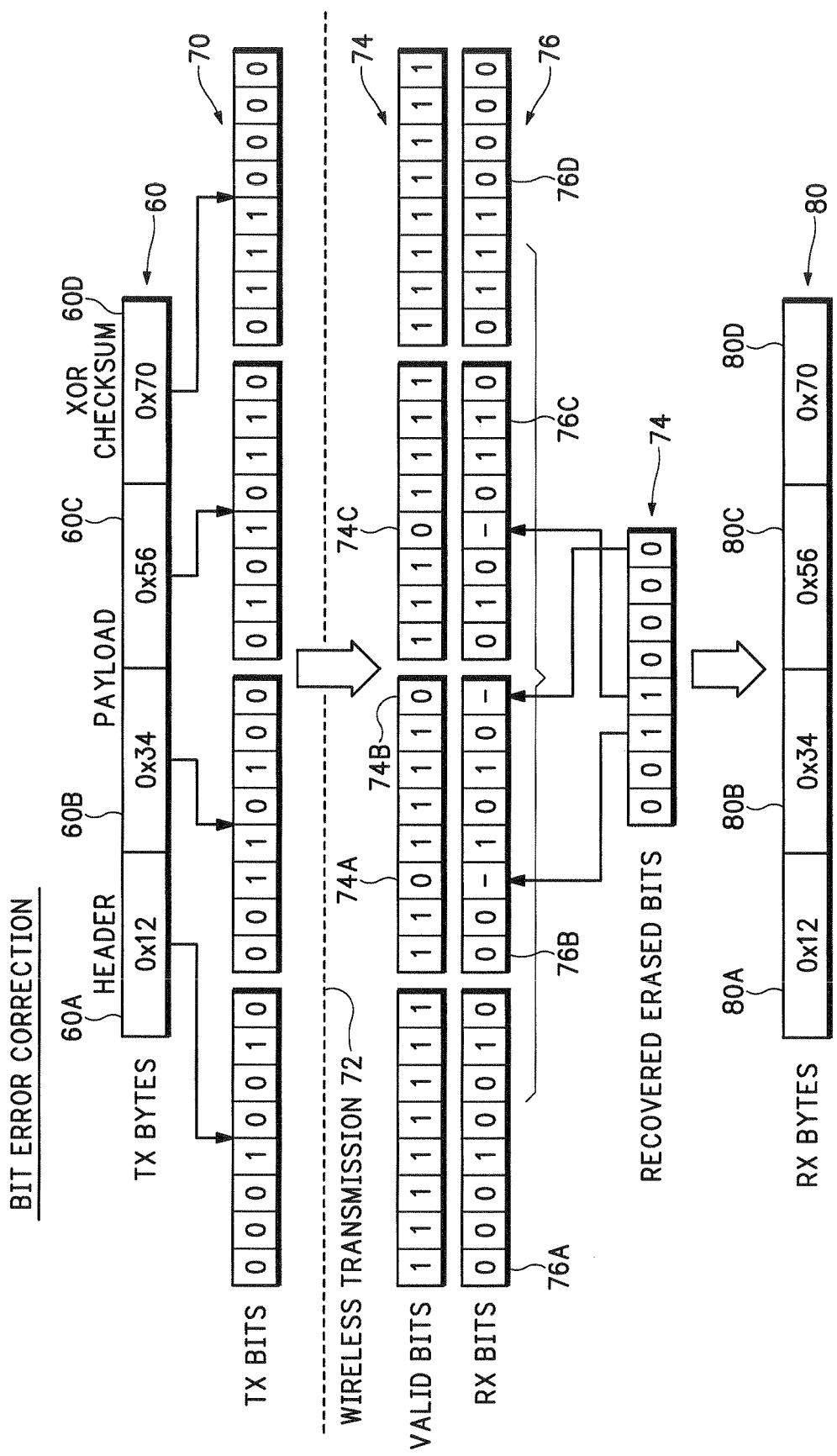
FIG. 5 shows how the VBEC is used to correct corrupted bits in transmitted packets.

FIG. 5 shows another example where the VBEC error correction is used for correcting corrupted bits in packet transmissions. A packet 60 includes a one byte header 60A having a hexadecimal value of '12', a two byte payload 60B and 60C having hexadecimal values of '34' and '56', respectively. The packet 60 also includes a one byte XOR checksum having a hexadecimal value of '70'. The binary equivalents of the hexadecimal values are shown in binary bits 70.

The binary bits 70 are PN encoded in a manner similar to what was described above in FIG. 2. However, as explained above, the PN codes can be any length and are typically 32 or 64 bits long. There can also be more than two PN codes used in the DSSS encoding. The PN bits representing binary bits 70 are transmitted over a wireless communication channel 72 by wireless device 12 (FIG. 1) to the wireless device 26. The wireless device 26 decodes the PN encoded bits similar to the DSSS decoder 50 shown in FIG. 3.

The DSSS decoder enters values into a valid bit register 74 and a receive bit register 76 similar to the manner described above in FIG. 3. For example, if a PN encoded bit sequence matches some threshold number of bits for a logic 0 PN code, a logic 0 value is entered into the corresponding location in receive register 76. The corresponding bit location in the valid bit register 74 is then set to a logic 1 value. If a PN bit sequence matches some threshold number of bits for a logic 1 PN code, a logic 1 value is entered into the corresponding location in receive register 76. The corresponding bit location in the valid bit register 74 is then set to a logic 1 value.

If the PN bit sequence does not match the required threshold number of bits for either the logic 0 or logic 1 PN codes, a logic "don't care" value ('-') is entered into the corresponding location in receive register 76. For example, the wireless device 26 may not change or set any value in the corresponding location in the receive register 76. The corresponding bit location in the valid bit register 74 is set to a logic 0 value.

After a complete packet has been received, the firmware in the wireless device 26 corrects the invalid bits identified in valid bit register 76 similar to the manner shown in FIG. 3.

Data in most typical data streams has one of two possible logic states, either logic 0 (low), or logic 1 (high). The DSSS system on the other hand can use the third state Error (E) or invalid state, denoting received data that does not correlate to a logic 1 or a logic 0 and therefore has been "erased." This E state was previously referred to above as "don't care" and is represented by a '-'. There is an almost negligible probability of data being corrupted rather than erased, because this would require interference to corrupt the majority of PN chips in such a way that the incoming data stream correlated with the PN code corresponding to the opposite logic state. Erasures are much easier to correct than errors.

In this example, three bits 74A, 74B and 74C could not be correlated with the PN codes. In other words, the number of PN bits in the received bit stream did not match a threshold number of PN code bits. The uncorrelated bits 74A, 74B AND 74C are corrected by using the XOR checksum operation described above in FIG. 3. The invalid bits 74A, 74B and 74C are all in different bit columns of the packet byte segments as shown below:

Received Packet Data

| Received Packet Data | |
|---|---|
| 00010010 | decoded bits for header 76A |
| 00-1010- | decoded bits for payload 76B |
| 010-0110 | decoded bits for payload 76C |
| 01110000 | decoded bits for XOR checksum 76D |

The XOR checksum operation is performed for each bit column having an invalid bit.

For example, the decoded bit values for the third bit column are as follows: '0-01'. An XOR operation for the first two valid bits generates the result: 0 XOR 0=0. The resulting logic 0 value is then XORed with the remaining valid bit generating the result: 0 XOR 1=1. The resulting logic 1 value is used to replace the '-' value in the third bit location of decoded packet payload 76B and restore packet payload 80B. A similar XOR process is used in column 4 and in column 8 to correct the other two invalid bit values. Thus, the original value '00110100' is restored for packet payload 80B and the original value '01010110' is restored for packet payload 80C. The decoded header 80A and decoded checksum 80D in register 80 do not have invalid bits and accordingly do not have to be corrected.

Figure 6:
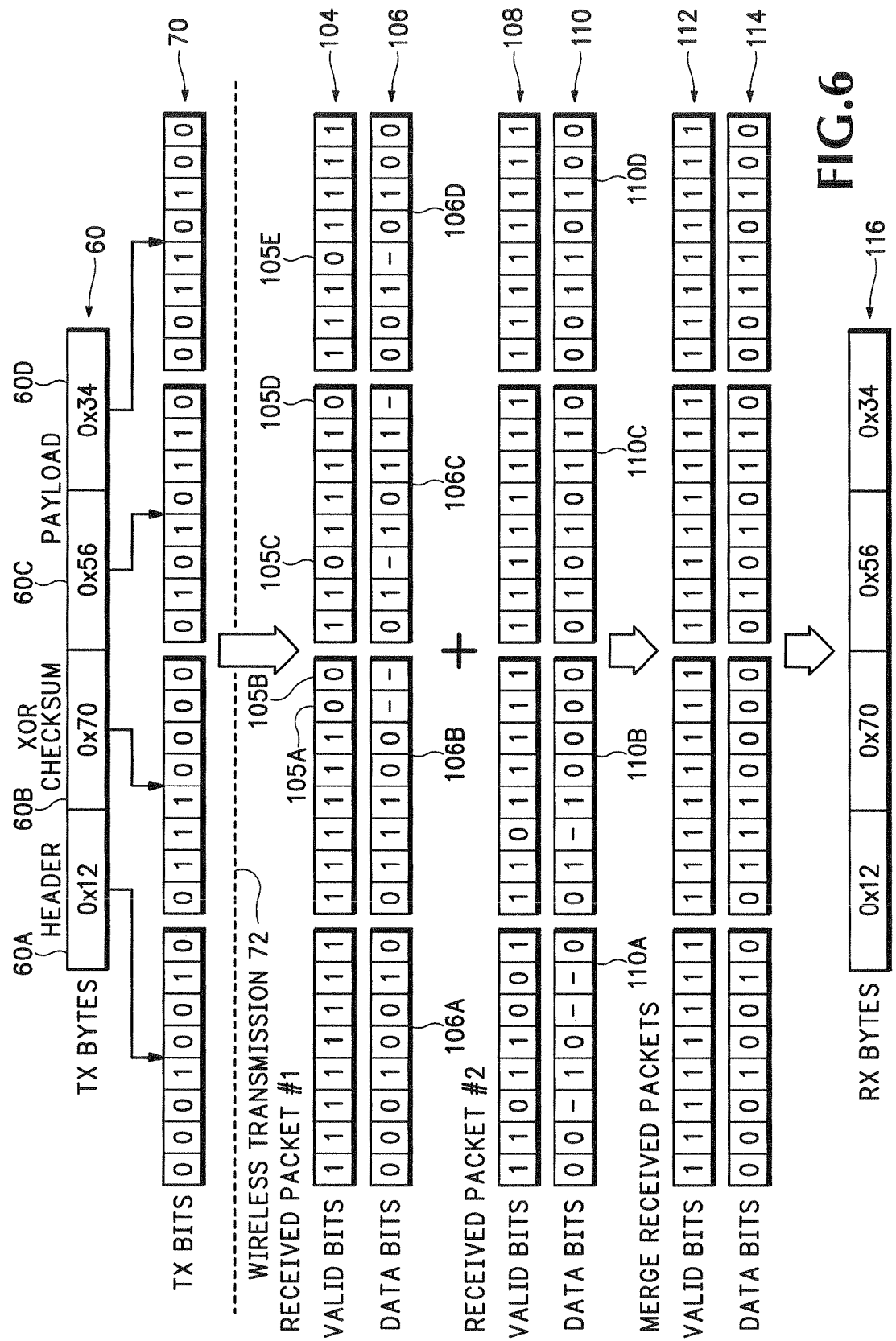
FIG. 6 shows how the VBEC may use multiple packets to correct corrupted bits.

Referring to FIG. 6, packets may contain invalid bits that cannot be corrected using the XOR checksum. For example, the XOR checksum may not be able to correct multiple invalid bits in the same bit column. Therefore the packet 60 would need to be retransmitted. The valid bits are then intelligently merged together to create a valid version of the packet 60.

For example, in FIG. 6 the same packet 60 shown in FIG. 5 is transmitted by wireless device 12 to wireless device 26. The binary bit equivalents of the contents in header 60A, checksum 60B, payload 60C and payload 60D are again shown by binary values 70. The PN codes for binary values 70 are wirelessly transmitted to the wireless device 26. The received data bits after DSSS decoding are shown in data register 106. Several bits 105A-105E in valid bit register 104 identify invalid bits in data register 106. Normally the valid bit error correction described above could be used to correct the invalid bits in data bit register 106. However, in this example, there is more than one invalid bit in the same bit column.

For example, the DSSS decoded bits in data register 106 are aligned in columns as follows:

| | |
|---|---|
| 00010010 | DSSS decoded packet header 106A |
| 011100-- | DSSS decoded packet checksum 106B |
| 01-1011- | DSSS decoded packet payload 106C |
| 001-0100 | DSSS decoded packet payload 106D |

As can be seen, there is only one invalid bit in the third, forth and seventh columns of the decoded packet. These invalid bits can be corrected as described above in FIGS. 2-5. The corrected bits are shown below.

| | |
|---|---|
| 00010010 | corrected packet header 106A |
| 0111000- | corrected packet checksum 106B |
| 0101011- | corrected packet payload 106C |
| 00110100 | corrected packet payload 106D |

However, there are still two remaining invalid bits in the eighth column that cannot be corrected. To correct the two invalid bits in the eighth column, a second DSSS encoded packet 60 is transmitted by the wireless device 12 to the wireless device 26. If the second received packet has invalid bits, the firmware in the wireless device 26 checks to see the previously decoded copy of packet 60 in data register 106 can be merged together with the valid data bits from the second DSSS decoded packet in data register 110.

It is possible that the wireless device 26 may wait until the second packet 60 is decoded before conducting any XOR checksum operations. For example, if all of the invalid bits in data register 106 have corresponding valid bits in the second data register 110, then no bit correction may be required and the two sets of bits are merged to create the corrected packet data in data register 114. Similarly, if all of the data bits in data register 110 are valid, then the second transmitted packet can replace the first transmitted packet.

However, if the packet still has invalid bits after being merged, the XOR checksum algorithm can be invoked to correct any remaining invalid bits in data register 114. Another packet can be transmitted when the merged data in data register 114 has more than one invalid bit in the same bit column.

Advantages of valid bit error correction include increased correction of errors, decreased retransmissions, and a reduction in the amount of error correction information that is required to be transmitted in order to correct a small number of data bits. Another advantage is that multiple versions of a packet can be merged into a single valid packet, dramatically increasing the interference tolerance of the wireless system. Valid bit error correction is also more robust to interference and noise than conventional error correction systems.

The system described above can use dedicated processor systems, micro controllers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

The invention claimed is:

1. A wireless device, comprising:
a data register configured to hold data decoded from Pseudo Noise (PN) encoded data;
a valid register configured to identify invalid PN decoded data in the data register, the invalid data having a bit that does not correlate to either a logic 1 or a logic 0; and
a circuit configured to correct the invalid data identified in the data register by using valid data in the PN decoded data,
wherein the circuit conducts a separate Exclusive-OR (XOR) operation on all the valid data bits in respective bit columns that contain only one of the identified invalid data bits and replaces the invalid data bit of each such bit column with a result from the corresponding XOR operation.

2. The wireless device according to claim 1 including a Direct Sequence Spread Spectrum (DSSS) decoder configured to decode the PN encoded data into data bits and identify valid and invalid data bits according to a number of PN bits in the PN encoded data that correlate with preconfigured PN codes.

3. The wireless device according to claim 1 wherein one of the valid data bits used in the XOR operation is an XOR checksum value previously derived from the originally transmitted data bits in the same bit column.

4. The wireless device according to claim 1 wherein the circuit requests a second transmission of the same PN encoded data when the valid register identifies more than one invalid bit in a same relative bit column location for different data segments in the data register.

5. The wireless device according to claim 4 wherein the circuit replaces any of previously identified invalid data bits with corresponding valid data bits identified in the second PN encoded data transmission and corrects any remaining invalid data bit by conducting an Exclusive-OR (XOR) operation on all the valid data bit in a same bit column as the remaining invalid data bit and replacing the remaining invalid data bit with a result from the XOR operation.

6. The wireless device according to claim 1 wherein the circuit receives wireless Direct Sequence Spread Spectrum (DSSS) signals containing the PN encoded data.

7. A method for correcting data in a Direct Sequence Spread Spectrum (DSSS) signal, comprising:
receiving a DSSS encoded data packet;
decoding the DSSS encoded data packet;
identifying invalid data that can not be successfully DSSS decoded; and
using an erasure correction operation with valid data in the decoded data packet to correct the identified invalid data including performing a separate Exclusive-OR (XOR) operation on all the identified valid data bits located in respective bit columns as contain only one identified invalid data bit and replacing the invalid data bit of each such bit column with a result from the corresponding XOR operation.

8. The method according to claim 7 including:
decoding the DSSS encoded data by comparing sequences of received Pseudo Noise (PN) data bits with predetermined PN code bits;
identifying any of the sequences of received PN data bits that correlate with a predetermined number of PN code bits as valid data bits;
identifying any of the sequences of received PN data bits that do not correlate with the predetermined number of PN code bits as invalid data bits; and
conducting a checksum with the identified valid data bits to correct the identified invalid data bits.

9. The method according to claim 7 including:
identifying bit columns in the DSSS decoded data that have more that one invalid data bit;
requesting retransmission of the DSSS encoded data;
decoding the retransmitted DSSS encoded data into a second set of valid and data bits that are capable of being invalid; and
replacing any identified invalid data bits from the previously decoded DSSS encoded data with corresponding valid bits from the second set of data bits generating a merged set of data bits.

10. The method according to claim 9 including:
identifying any remaining invalid bits in the merged set of data bits; and
performing an Exclusive-OR (XOR) operation on valid data bits located in a same bit column with the identified remaining invalid data bit and replacing the remaining invalid data bit with a result from the XOR operation.

11. The method according to claim 7 including:
generating checksums for packets;
DSSS encoding the packets together with the generated checksums;
wirelessly transmitting the DSSS encoded packets;
decoding the DSSS encoded packets;
identifying valid and invalid DSSS decoded bits during the DSSS decoding;
identifying a set of valid bits having a same relative bit location in each byte of the packet as one of the identified invalid bits; and
conducting an Exclusive-OR (XOR) operation with the identified set of valid bits and replacing the identified invalid bit with a result of the XOR operation.

12. The method according to claim 7 including:
generating a checksum for the data;
adding the checksum to the data;

sending multiple code bits that represent single logic values in the data;

decoding the multiple code bits into data bits;

identifying the data bits that are successfully decoded as valid data bits and identifying the data bits that are not successfully decoded as invalid data bits; and using the identified valid data bits to correct the identified invalid data bits.

13. A wireless transmission system, comprising:

a first wireless device configured to generate respective checksums for different sets of data bits corresponding to respective data value locations in different segments of a packet, the first wireless device encoding the data bits and the generated checksums into Pseudo Noise (PN) codes and wirelessly transmitting the PN codes; and a second wireless device wirelessly receiving the transmitted PN codes and using the PN codes to determine which data bits were successfully received and which data bits are erased and, additionally, using the respective checksums applied to corresponding data value locations in the packet to recover the data bits that are erased including a valid error correction circuit in the second wireless device that corrects the invalid bits by identifying all the valid bits in respective data value locations as contain an identified invalid bit in different segments of the packet, performing a separate Exclusive-OR (XOR) operation on all the identified valid bits of each respective data value location, and replacing the identified invalid bit of each respective data value location with a result of the corresponding XOR operation.

14. The wireless transmission system according to claim 13 including an Exclusive-OR (XOR) check sum generator in the first wireless device for generating the respective checksums to be applied to the corresponding data value locations.

15. The wireless transmission system according to claim 14 including a DSSS encoder in the first wireless device for encoding the data bits and the generated checksums into Direct Sequence Spread Spectrum (DSSS) data.

16. The wireless transmission system according to claim 15 including a DSSS decoder in the second wireless device decoding the DSSS data back into data bits and also identifying valid and invalid data bits in the decoded DSSS data.

17. The wireless transmission system according to claim 13 wherein the first wireless device resends the packet when there is more than one invalid bit in one of the respective data value locations and the second wireless device then replaces invalid bits in the previously received packet with corresponding valid bits decoded from the resent packet.

* * * * *